United States Patent [19]

Kawakami

[11] Patent Number: 4,525,864
[45] Date of Patent: Jun. 25, 1985

[54] DEVICE FOR GENERATING A TUNING FREQUENCY SET COMMAND SIGNAL OF A TUNER SYSTEM

[75] Inventor: Yasuo Kawakami, Kawagoe, Japan

[73] Assignee: Pioneer Electronic Corporation, Tokyo, Japan

[21] Appl. No.: 546,043

[22] Filed: Oct. 27, 1983

[30] Foreign Application Priority Data

Oct. 29, 1982 [JP] Japan ................. 57-190364

[51] Int. Cl.³ ................... H03J 7/20; H04B 1/16
[52] U.S. Cl. .................. 455/160; 455/161; 455/179
[58] Field of Search ........... 455/160, 161, 165, 179, 455/183; 358/191.1, 193.1

[56] References Cited

U.S. PATENT DOCUMENTS 4,041,535 8/1977 Rzeszewski et al. .......... 455/160
4,220,973 9/1980 Macchetta ................ 358/193.1
4,353,131 10/1982 Yueh .................... 455/179

FOREIGN PATENT DOCUMENTS 62620 4/1982 Japan .................... 455/161

Primary Examiner—Marc E. Bookbinder
Attorney, Agent, or Firm—Schwartz, Jeffery, Schwaab, Mack, Blumenthal & Evans

[57] ABSTRACT

A device for generating a tuning frequency set command signal for a tuner system having a manual tuning mode and an automatic channel scanning mode, including a manually operable means for generating an up control signal for raising the tuning frequency and a manually operable means for generating a down control signal for lowering the tuning frequency, and timing means for measuring the duration of the up or down control signal, and control means for automatically selecting the automatic channel scanning mode when the duration of the up or down control signal becomes longer than a predetermined time period, is characterized by a reset means for resetting the timing means each time when the up or down control signal disappears, thereby alleviating the fear that the automatic channel scanning mode is erroneously selected when the means for generating up or down control signal is operated more than one time within the predetermined time period.

2 Claims, 11 Drawing Figures

Fig. 1 PRIOR ART
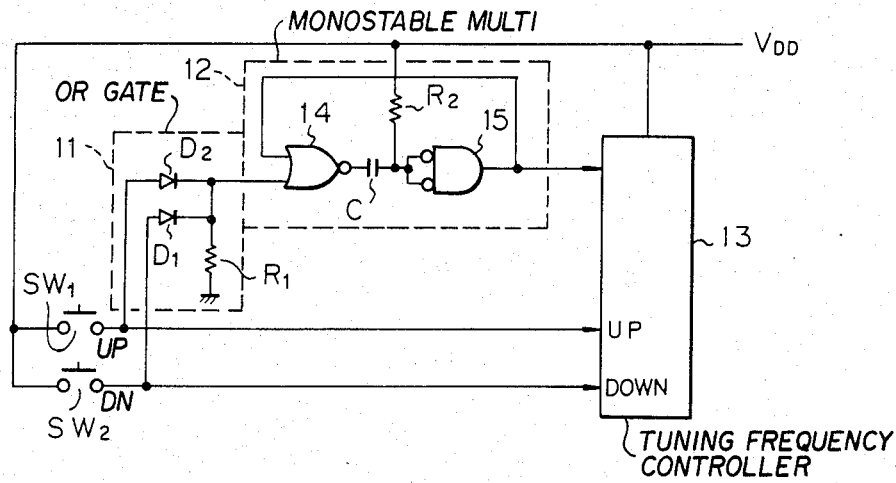
Fig. 2A
Fig. 2B
Fig. 2C
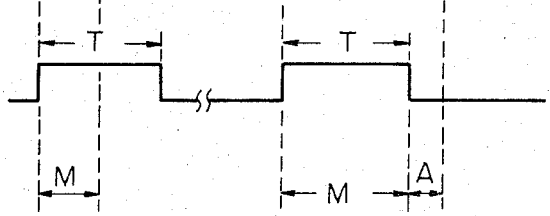
Fig. 3A
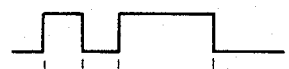
Fig. 3B
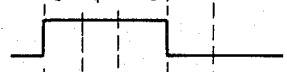
Fig. 3C
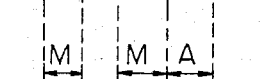

Fig. 4
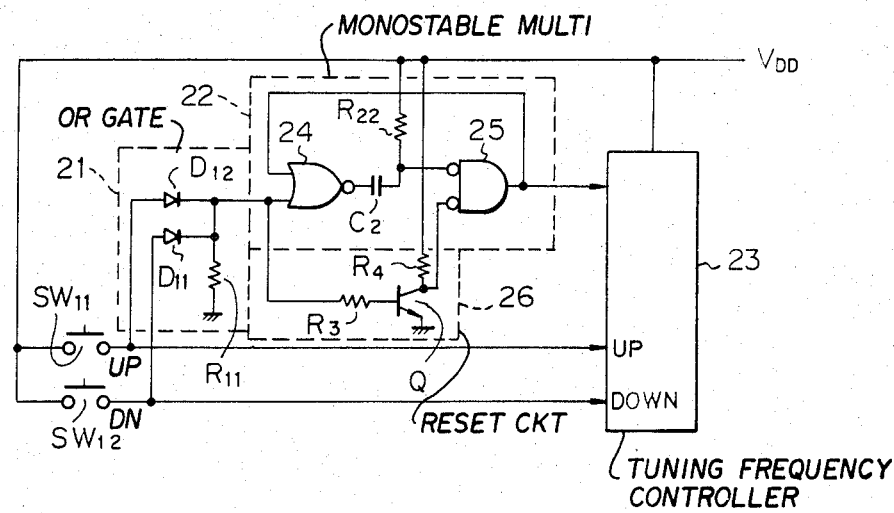
Fig. 5A
Fig. 5B
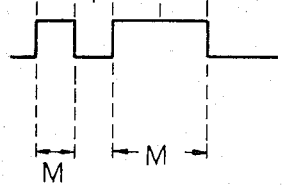
Fig. 5C

DEVICE FOR GENERATING A TUNING FREQUENCY SET COMMAND SIGNAL OF A TUNER SYSTEM

BACKGROUND OF THE INVENTION

1. Field of the Invention

The present invention relates to a device for generating a control signal of a tuner system, and more specifically to a device for generating a tuning frequency set command signal of a tuner system which is provided with a function of automatic channel scanning.

2. Description of Background Information

There is a type of tuner having a function of automatic channel scanning in which the automatic scanning of the tuning frequency is performed until a signal from a station is captured. As an example, tuners equipped with a PLL synthesizer circuit have this automatic channel scanning function. In the case of the tuner of this type, the use of an additional switch for commanding the automatic channel scanning is eliminated because such an increase in the number of control switches would deteriorate the easiness of handling of the tuner. Therefore, it is general to assign the function of commanding the automatic channel scanning, to the up and down command switches or buttons for the manual tuning operation. If the up or down switch is pressed for a period shorter than a predetermined length of time, the tuner selects the manual tuning operation in which the scanning of the tuning frequency is effected at a constant speed until the pressure on switch is removed. On the other hand, if the up or down switch is pressed for a time period longer than the predetermined length, the tuning operation is switched to the above mentioned automatic channel scanning.

However, in the case of a conventional device for generating a tuning frequency set command signal, there was a drawback that if the up or down switch is pressed more than one time within the predetemined time period, then the automatic scanning mode is selected against the operator's will, even if the duration of each time of pressing is shorter than the predetermined period.

SUMMARY OF THE INVENTION

An object of the present invention is therefore to provide a device for generating a tuning frequency set command signal in which the erroneous production of the automatic channel scanning command signal is avoided by automatically resetting a timing means for measuring the duration of the up or down command signal each time when the up or down command signal disappears.

Another object of the present invention is to provide a device for generating a tuning frequency set command signal with means for resetting the timing means by using relatively simple circuit construction and without causing substantial increase in the manufacturing cost.

According to the present invention, a device for generating a tuning frequency command signal of a tuner system, including first control signal generation means for generating a first control signal for shifting a tuning frequency of the tuner system in a first direction, second control signal generation means for generating a second control signal for shifting the tuning frequency in a second direction, timing means for generating a timing signal during a predetermined time period after initiation of the generation of either one of the first and second control signals, and control means for controlling the tuning frequency of the tuner system, in accordance with a manual control mode and an automatic control mode, the control means operates to select the automatic control mode when the first or second control signal is present, is characterized by a reset means for resetting the timing means at a time when either one of the first and second control signal disappears.

According to another aspect of the invention, the first and second control signal generating means take the form of a first and second switches connected to a source of a power voltage, to respectively produce a high level output signal as the first control signal and the second control signal, and the timing means is responsive to the high level output signals of the first and second switches, and wherein the reset means takes the form of an emitter grounded transistor whose base is applied with the high level output signals of the first and second switches and whose collector is connected to the source of the power voltage via a resistor, thereby producing high level reset signal when the high level input signal at the base thereof turns off.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following description taken in conjunction with the accompanying drawings which are given by way of illustration only, and thus are not limitative of the present invention, and wherein:

FIG. 1 is a block diagram showing an example of conventional device for generating a turing frequency set command signal of a tuner system;

FIGS. 2A, 2B, 2C are timing charts showing an operation of the device of FIG. 1 for explaining a normal state of operation;

FIGS. 3A, 3B, 3C are timing charts showing an operation of the device of FIG. 1 for explaining an operation of the device under an abnormal condition;

FIG. 4 is a block diagram showing an embodiment of the device for generating a tuning frequency set command signal of a tuner system according to the present invention; and FIGS. 5A, 5B, 5C are timing charts showing an operation of the device of FIG. 4.

DETAILED DESCRIPTION OF THE PREFERRED EMBODIMENTS

Before entering into the explanation of the present invention, reference is first made to FIG. 1 which shows an example of the conventional device for generating a tuning frequency set command signal of a tuner system.

As shown, the device includes an up command switch $SW_1$ and a down command switch $SW_2$ which are commonly applied with a power supply voltage $+V_{DD}$ at first terminals thereof. By pressing the up command switch $SW_1$, a high level up command signal is produced at a second terminal which is connected to an up command input terminal of the tuning frequency controller 13. Also, by pressing the down command switch SW$_2$, a high level down command signal is produced at a second terminal thereof which is connected to a down command input terminal of the tuning frequency controller 3. The thus produced high level up and down command signals are also applied to a logic OR circuit 11 which is indicated as a portion enclosed by the dashed lines in FIG. 1. The OR circuit 11 consists of a diode D$_1$ connected to the second terminal of the up command switch SW$_1$, a second diode D$_2$ connected to the second terminal of the down command switch SW$_2$, and a resistor R$_1$ commonly connected to the cathodes of the diodes D$_1$ and D$_2$.

An output signal of the OR circuit 11 is then applied to a trigger input terminal of a monostable multivibrator (MMV hereinafter) 12 also indicated by a portion enclosed by dashed lines in FIG. 1. The MMV 12 consists of a NOR circuit 14 one of whose input terminals is used as a trigger input terminal of the MMV 12 and a NOR circuit 15 connected to an output terminal of the NOR circuit 14. When the up command signal or the down command signal from the OR circuit 11 is applied to the trigger input terminal, an output level of the NOR circuit 14 turns down to the logical low level. This low level output signal of the NOR circuit 14 is then applied, via a capacitor C, to commonly connected input terminals of the NOR circuit 15 which operates also as an inverter. Consequently, the output level of the NOR circuit 15 turns high. The output signal of the NOR circuit 15 is also applied to the other input terminal of the NOR circuit 14 to form a feedback loop through the NOR circuits 14 and 15. Thus the output signal level of the NOR circuit 14 is maintained at low level.

At the junction between the capacitor C and the input terminals of the NOR cirucit 15, there is connected a resistor R$_2$ which on the other hand, is connected to the source of the power voltage +VDD. Since a charging current is supplied to the capacitor C through the resistor R$_2$, the voltage level at the input terminals of the NOR circuit 15 gradually increases in accordance with a time constant determined by the capacitance value of the capacitor C and the resistance value of the resistor R$_2$. When a time period T has elapsed after the initiation of charging of the capacitor C upon which the output signal level of the NOR circuit 15 turned to the high level, the output signal level of the NOR circuit 15 returns to the low level. The thus produced output signal of the NOR circuit 15 is applied at an input terminal for a change over command signal of the tuning frequency controller 13, as a Q output signal of the MMV 12.

The tuning frequency controller 13 is constructed to control the tuning frequency by changing a dividing ratio of a VCO (Voltage Controlled Oscillator) of a PLL (Phase Locked Loop) circuit which produces a local oscillation signal. In accordance with the up command signal, the down command signal, and the Q output signal of the MMV 12, the tuning frequency controller 13 performs the following operations. Firstly, when the up command signal or the down command signal is present and the level of Q output signal of the MMV 12 is high, the frequency controller 13 is set at the manual operation. More specifically, during the presence of the up command signal, the dividing ratio of the VCO is varied so as to raise the oscillation frequency of the VCO at a predetermined rate of increase. On the other hand, during the presence of the down command signal, the dividing ratio of the VCO is varied so as to lower the oscillation frequency of the VCO at a predetermined rate of decrease. Nextly, when the up command signal or down command signal is present and the level of the Q output signal of the MMV 12 is low, both of the up command signal and the down command signal are transmitted to the frequency controller 13 and the so-called sweep operation in which the oscillation frequency of the VCO is varied throughout the varing range by changing the dividing ratio of the VCO even after the termination of the up command signal or the down command signal, is selected. The sweep operation is stopped, for example, by the detection of the presence or absence of the IF (Intermediate Frequency) signal and the subsequenct cease of varying control of dividing ratio of the VCO.

As shown in FIGS. 2A to 2C, in the case of the above described the device for generating the tuning frequency set command signal according to the conventional technique, since the level of the Q output of the MMV 12 turns high simultaneously with the generation of the up command signal or the down command signal, and remains high for the time period T. Therefore, the manual operation command M consisting of the up command or the down command is transmitted to the frequency controller 13 as an automatic channel selection command signal A when the duration of the up command signal or the down command signal becomes longer than the time period T. Accordingly, the automatic selection of the channel is enabled by pressing the up command switch SW$_1$ or the down command switch SW$_2$ for the time period longer than T, and the necessity of providing a switch for commanding the automatic channel selection is eliminated.

However, as shown in FIGS. 3A to 3C, if an up command signal or a down command signal is produced before the elapse of the time period T after the previous generation of the up command signal or the down command signal, the level of the Q output signal of the VCO turns to the low level during the presence of the up or down command signal even if the duration of each of the up or down command signal is shorter than the period T. Consequently the manual operation command M consisting of the up or down command signal is applied to the tuning frequency controller 13 as the automatic tuning frequency control command signal A, as especially shown in FIG. 3C. This is because the level or the Q output signal of the MMV 12 is maintained at high level only for the time period T after the timing of first generation of the up or down command signal.

With respect to this drawback, it is conceivable to employ a retriggerable type monostable multivibrator (MMV) instead of the usual type MMV as the timing means. However, in that case, there are several problems such that the number of the circuit elements increases and the circuit construction of the device becomes complicated. Moreover, that would cause an adverse effect on the efficiency of assembling or mounting of the circuit elements, and further on the manufacturing cost of the device. Further, with respect to the problem relating to the mounting of the circuit elements, the use of the integrated circuit is preferable. However, in this case, the problem of the manufacturing cost still remains unsolved since the price of the integrated circuit is relatively high even in the case of an integrated circuit of the general purpose.

Turning now to the circuit diagram of FIG. 4, the device for generating the command signal of the tuning frequency set operation of a tuner according to the present invention will be explained hereinafter.

As shown, the device includes an up command switch $SW_{11}$, a down command switch $SW_{12}$, and an OR circuit 21, a monostable multivibrator (MMV) 22, and a tuning frequency control circuit 23, and these circuit elements are interconnected with each other in the same manner as the arrangement of FIG. 1. Specifically, the output signals of the UP command switch $SW_{11}$ and the down command switch $SW_{12}$ are applied to the OR circuit 21. The OR circuit 21 consists of a diode $D_{11}$ connected to the second terminal of the up command switch $SW_{11}$, a second diode $D_{12}$ connected to the second terminal of the down command switch $SW_{12}$, and a resistor $R_{11}$ commonly connected to the cathodes of the diodes $D_{11}$ and $D_{12}$.

The output signal of the OR circuit 21 is then applied to the frequency control circuit 23 via the MMV 22. In this circuit arrangement, the output signal of the OR circuit 21 is also applied to a reset circuit 26 in which the input signal is applied to the base of the transistor Q via an input resistor $R_3$. At the collector of the transistor Q, there is applied a power current $+V_{DD}$ via a resistor $R_4$. The collector output signal of the transistor Q is then applied to the one of the input terminals of the NOR circuit 25 in the monostable multivibrator 22. The other input termainal of the NOR circuit 25 is applied with a signal which develops at the junction between the capacitor $C_2$ and the resistor $R_{22}$. In this arrangement, when one of the up command signal of the high level and the down command signal of the low level, is generated, the transistor Q turns "on" by the application of this signal to the base thereof. Subsequently, the level of the collector output signal turns low and the NOR circuit 25 which receives this collector output signal at one of the input terminals operates as an inverter for inverting the signal developed at the junction between the capacitor $C_2$ and the resistor $R_{22}$, and consequently the output signal of the NOR circuit 25 turns to the high level.

After that, if either of the up command signal or the down command signal is present at least for the time period T, the output signal level of the NOR circuit 25 returns to the low level as was the case in the operation of the circuit of FIG. 1. If the up command signal or the down command signal disappears before the elapse of the time period T after the rising of the level of the output signal of the NOR circuit 25, the transistor Q turns off and the collector output signal of the transistor Q turns to the high level. Accordingly, the output signal of the NOR circuit 25 to which the collector output signal of the transistor Q is applied at one of input terminals, turns to the low level.

The output signal of the NOR circuit 25 is applied to the other input terminal of the NOR circuit 24 to form a positive feedback loop through the NOR circuits 24 and 25. Therefore, by the low level output signal of the NOR circuit 25, the output signal of the NOR circuit 24 turns to the high level and the electric charge in the capacitor $C_2$ is discharged to reset the monostable multivibrator 22 at the initial state.

With this feature, even if the up or down command signal is generated within the time period T after the termination of the previous one of the up or down command signal, the monostable multivibrator 22 is reset at the initial state at the timing of extinction of the up or down command signal, the monostable multivibrator 22 is triggered each time when the up or down command signal is generated. Accordingly, as shown in FIG. 5B, the level of the Q output signal of the monostable multivibrator 22 is maintained high until the up or down command signal disappears if the duration of the up or down command signal is shorter than the period T. Therefore, as shown in FIG. 5C, it becomes possible to transmit the command of the manual operation M consisting of the up command signal and the down command signal to the tuning frequency controller circuit 23 without fail.

It will be appreciated from the foregoing, the device generating a tuning frequency set command signal of a tuner system is provided with reset means for resetting the timing means. Therefore, an operation of timing means which can be obtained by using a retriggerable monostable multivibrator is secured even if a monostable multivibrator of a simple construction which is not retriggarable, is employed. Accordingly, the fear that the command of the automatic channel selection is made erroneously in a specific condition, is alleviated in the case of the device according to the present invention. In addition, since the complication of the circuit construction of the timing means is avoided and the increase in number of the circuit elements is very small, the problem of mounting is minimized. Further, the increase in the cost of production is maintained at very low level.

It should be understood that the foregoing description is for illustrative purpose only, and is not intended to limit the scope of the invention. Rather, there are numerous equivalents to the preferred embodiments, and such are intended to be covered by the appended claims.

As an example, it is conceivable to provide a capacitor in parallel with the resistor $R_4$ so as to delay the timing of the collector output signal of the transistor of the reset circuit 26. With this provision, a positive operation of the reset circuit 26 is secured by resetting the monostable multivibrator 22 sufficiently after the extinction of the up or down command signal.

In addition, although the monostable multivibrator 22 is made up of a pair of NOR circuits 24 and 25 in the above embodiment, it is needless to say that the present invention is applicable to the cases in which the monostable multivibrator 22 is made up of such circuit elements as NAND circuits or active elements, for example, transistors. Similarly, although the transistor Q and resistors $R_3$ and $R_4$ are used for the reset circuit 26 in the above embodiment, various type of circuit construction acting as an inverter can be used for the reset circuit 26.

What is claimed is:

1. A device for generating a tuning frequency command signal of a tuner system, including:
   first control signal generation means for generating a first control signal for shifting a tuning frequency of the tuner system in a first direction;
   second control signal generation means for generating a second control signal for shifting the tuning frequency in a second direction;
   timing means for generating a timing signal during a predetermined time period after initiation of the generation of either one of said first and second control signals; and
   control means coupled to said timing means and said first and second control signal generation means for controlling the tuning frequency of the tuner system, in accordance with a manual control mode and an automatic control mode, said control means operates to select said automatic control mode when the first or second control signal is present after extinction of said timing signal, characterized by a reset means coupled to said first and second control signal generation means for resetting said timing means at a time when either one of the first and second control signals disappears.

2. A device as set forth in claim 1, wherein said first and second control signal generating means comprise first and second switches connected to a source of a power voltage, to respectively produce a high level output signal as the first control signal and the second control signal, and said timing means is responsive to the high level output signals of at least one of the first and second switches, and wherein said reset means comprises an emitter grounded transistor whose base responsive to the high level output signals of at least one of the first and second switches and whose collector is connected to the source of the power voltage via a resistor, thereby producing a high level reset signal when the high level input signal at the base thereof turns off.

* * * * *